(12) United States Patent
Coffey et al.

(10) Patent No.: US 11,226,453 B2
(45) Date of Patent: Jan. 18, 2022

(54) BOARD MOUNTED ACTIVE COMPONENT ASSEMBLY

(71) Applicant: CommScope Technologies LLC, Hickory, NC (US)

(72) Inventors: Joseph Christopher Coffey, Burnsville, MN (US); Paul John Pepe, Clemmons, NC (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 16/059,493

(22) Filed: Aug. 9, 2018

(65) Prior Publication Data

US 2019/0049669 A1 Feb. 14, 2019

Related U.S. Application Data

(60) Provisional application No. 62/542,899, filed on Aug. 9, 2017.

(51) Int. Cl.
| | |
|---|---|
| *G02B 6/38* | (2006.01) |
| *G02B 6/42* | (2006.01) |
| *H05K 1/14* | (2006.01) |
| *H05K 1/18* | (2006.01) |
| *G02B 6/43* | (2006.01) |

(52) U.S. Cl.
CPC ......... *G02B 6/3825* (2013.01); *G02B 6/3897* (2013.01); *G02B 6/428* (2013.01); *G02B 6/4246* (2013.01); *G02B 6/4292* (2013.01); *G02B 6/43* (2013.01); *H05K 1/141* (2013.01); *H05K 1/181* (2013.01); *G02B 6/3895* (2013.01); *H05K 2201/10121* (2013.01); *H05K 2201/10189* (2013.01); *H05K 2201/10446* (2013.01)

(58) Field of Classification Search
None
See application file for complete search history.

(56) References Cited

U.S. PATENT DOCUMENTS

| | | | | |
|---|---|---|---|---|
| 5,419,717 A | * | 5/1995 | Abendschein | G02B 6/3817 385/139 |
| 6,227,911 B1 | * | 5/2001 | Boutros | H01R 13/719 439/490 |
| 6,543,941 B1 | * | 4/2003 | Lampert | G02B 6/3807 385/58 |
| 7,013,088 B1 | * | 3/2006 | Jiang | G02B 6/4204 385/88 |
| 7,226,217 B1 | * | 6/2007 | Benton | G02B 6/3825 385/88 |
| 7,233,731 B2 | * | 6/2007 | Solheid | G02B 6/3893 385/135 |

(Continued)

*Primary Examiner* — Tina M Wong
(74) *Attorney, Agent, or Firm* — Merchant & Gould P.C.

(57) ABSTRACT

The present disclosure is directed to a board mounted active component assembly that includes a printed circuit board to which a connector is mounted and electrically connected. In one aspect, the connector includes a housing defining an adapter port for receiving an optical plug. The connector also includes a fiber optic transceiver module secured within the housing such that the transceiver module is optically aligned with an optical plug received in the adapter port. The fiber optic transceiver module includes a transmitter optical sub-assembly (TOSA) and a receiver optical sub-assembly (ROSA) with leads connected to a circuit on the printed circuit board.

16 Claims, 14 Drawing Sheets

(56) References Cited

U.S. PATENT DOCUMENTS

| | | | |
|---|---|---|---|
| 7,280,724 B2* | 10/2007 | Yoshikawa | G02B 6/4201 385/52 |
| 7,407,332 B2* | 8/2008 | Oki | G02B 6/4201 385/92 |
| 7,841,780 B2* | 11/2010 | Nelson | G02B 6/4201 385/88 |
| 7,909,622 B2* | 3/2011 | Pepe | H01R 13/516 439/95 |
| 8,731,405 B2* | 5/2014 | Renfro, Jr. | G02B 6/3878 398/117 |
| 8,757,895 B2* | 6/2014 | Petersen | G02B 6/3817 385/78 |
| 9,203,198 B2* | 12/2015 | Pepe | H01R 13/6658 |
| 9,285,552 B2* | 3/2016 | Marcouiller | G02B 6/3817 |
| 9,448,367 B2* | 9/2016 | Ho | G02B 6/4293 |
| 9,531,109 B2* | 12/2016 | Gao | H01R 12/716 |
| 9,544,058 B2 | 1/2017 | Coffey et al. | |
| 9,709,760 B2* | 7/2017 | Stapleton | G02B 6/4283 |
| 9,918,416 B2* | 3/2018 | Mao | H05K 9/0058 |
| 10,014,942 B2 | 7/2018 | Coffey et al. | |
| 10,514,515 B2* | 12/2019 | Lin | G02B 6/4246 |
| 2002/0150374 A1* | 10/2002 | Hinman | G01B 11/27 385/136 |
| 2005/0018978 A1* | 1/2005 | Nevo | G02B 6/4246 385/92 |
| 2005/0281514 A1* | 12/2005 | Oki | H05K 9/0058 385/92 |
| 2005/0286839 A1* | 12/2005 | Yoshikawa | G02B 6/4201 385/92 |
| 2008/0175532 A1* | 7/2008 | Ruckstuhl | G02B 6/4296 385/16 |
| 2010/0124842 A1* | 5/2010 | Bu | H01R 13/518 439/541.5 |
| 2011/0222819 A1* | 9/2011 | Anderson | G02B 6/3825 385/78 |
| 2012/0208401 A1* | 8/2012 | Petersen | H01R 43/16 439/620.22 |
| 2012/0322310 A1* | 12/2012 | Taylor | H01R 24/64 439/620.23 |
| 2013/0323940 A1* | 12/2013 | Coffey | G02B 6/36 439/38 |
| 2014/0016902 A1* | 1/2014 | Pepe | G02B 6/3893 385/76 |
| 2014/0035755 A1* | 2/2014 | Ward | G08B 5/00 340/691.1 |
| 2014/0220794 A1* | 8/2014 | Taylor | H04Q 1/13 439/55 |
| 2016/0192545 A1* | 6/2016 | Mao | H05K 9/0058 398/136 |
| 2016/0285215 A1* | 9/2016 | Little | G02B 6/3817 |
| 2019/0049669 A1* | 2/2019 | Coffey | G02B 6/3825 |

* cited by examiner

BOARD MOUNTED ACTIVE COMPONENT ASSEMBLY

CROSS REFERENCE TO RELATED APPLICATION

This application claims the benefit of U.S. Provisional Application No. 62/542,899, filed Aug. 9, 2017, and titled "Board Mounted Active Component Assembly," the disclosure of which is hereby incorporated herein by reference.

BACKGROUND

The present invention relates to systems and methods for transmitter optical sub-assembly (TOSA) and a receiver optical sub-assembly (ROSA) modules (i.e. TOSA/ROSA modules) used for board mountable test applications having an ST interface for optical coupling. When systems of this type are used with a vertical cavity surface emitting laser (VCSEL), the narrow beam width produced by this device will result in an under filled launch condition. This requires the ST ferrule in the patch cord to be properly aligned to the source for optimum coupling of light energy. Any movement due to tolerance issues with ST couplers causes the alignment to change between the source and the ferrule. This alignment change makes the use of ST coupled VCSEL in test applications very problematic.

SUMMARY

In this disclosure, a TOSA and ROSA module is configured for use as both a source and a detector. These devices are inserted into in a plastic housing and actively aligned to the sleeve. Such a configuration eliminates tolerance issues because the alignment between the incoming ferrule and the source is maintained by the sleeve itself. Managed connectivity contacts can be incorporated in the housing design to enable the device to support managed connectivity applications. Other types of electronics can be incorporated into the housing to support signal and\or measurement applications, such as measuring the launch power of a TOSA and the received power in a ROSA. The difference in these two values can be used to determine the insertion loss of a cable assembly. Combining this with managed connectivity contacts allows a system comprised of the disclosed TOSA and ROSA design to program a managed connectivity patch cord with managed connectivity data (electrical) and calculate the insertion loss of the patch cord assembly (optical). This approach eliminate two steps in the assembly and manufacturing process.

In a visible laser embodiment, the housing can be designed to support a sleeveless visible laser housing, for example, in a 5.6 mm metal package. The design is based on characterization and calculations to ensure maximum coupling with no physical contact between the LC ferrule and the optical source. Other types of lasers can also be used in this design provided they meet the same or similar package design.

In one example embodiment of the disclosure, a board mounted active component assembly is presented that includes a printed circuit board to which a connector is mounted and electrically connected. In one aspect, the connector includes a housing defining an adapter port for receiving an optical plug. The connector can also include a fiber optic transceiver module secured within the housing such that the transceiver module is optically aligned with an optical plug received in the adapter port. The fiber optic transceiver module can include a transmitter optical sub-assembly (TOSA) and a receiver optical sub-assembly (ROSA) with leads connected to a circuit on the printed circuit board. In some examples, the connector includes a plurality of adapter ports. In some examples the adapter port(s) are LC-type adapter ports. In some examples, the housing includes a base shell to which a cover shell is attached.

A variety of additional aspects will be set forth in the description that follows. The aspects can relate to individual features and to combinations of features. It is to be understood that both the forgoing general description and the following detailed description are exemplary and explanatory only and are not restrictive of the broad inventive concepts upon which the examples disclosed herein are based.

DETAILED DESCRIPTION

Figure 1:
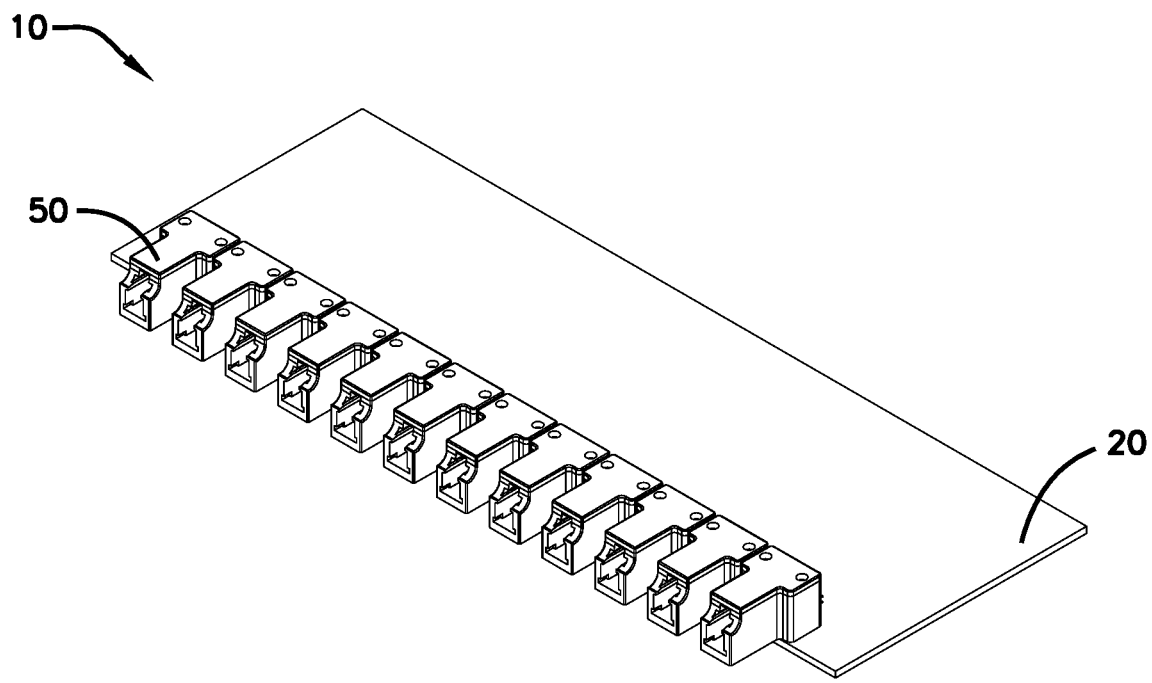
FIG. 1 shows a perspective view of a board mounted active component assembly having features that are examples of aspects in accordance with the principles of the present disclosure.
Figure 2:
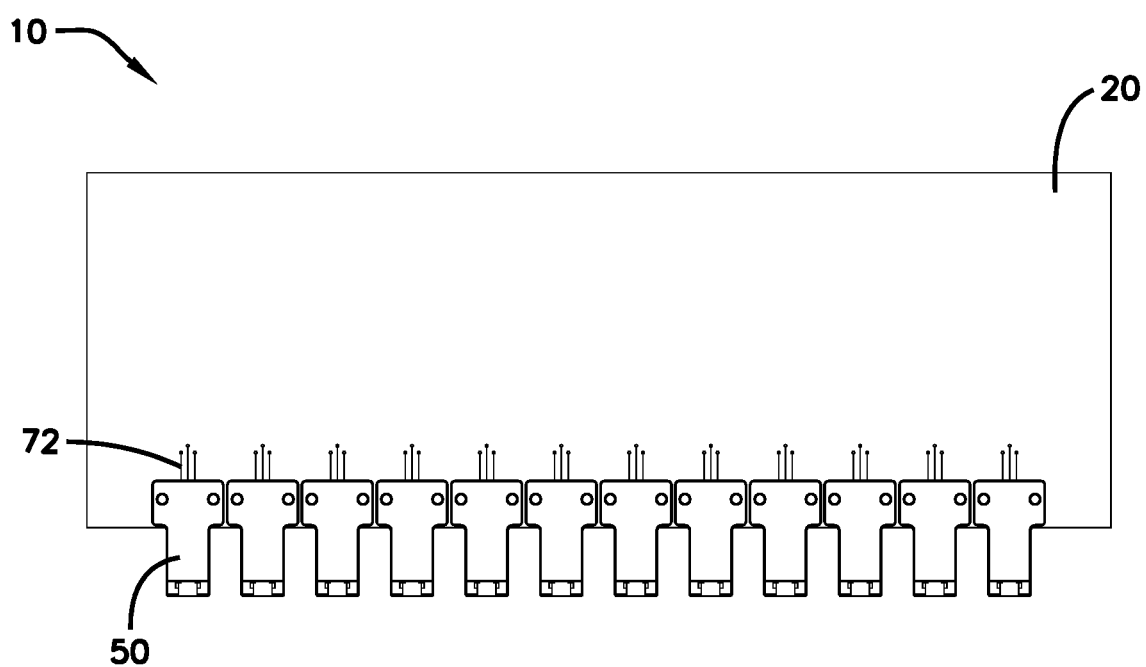
FIG. 2 is a top view of the board mounted active component assembly shown in FIG. 1.
Figure 3:
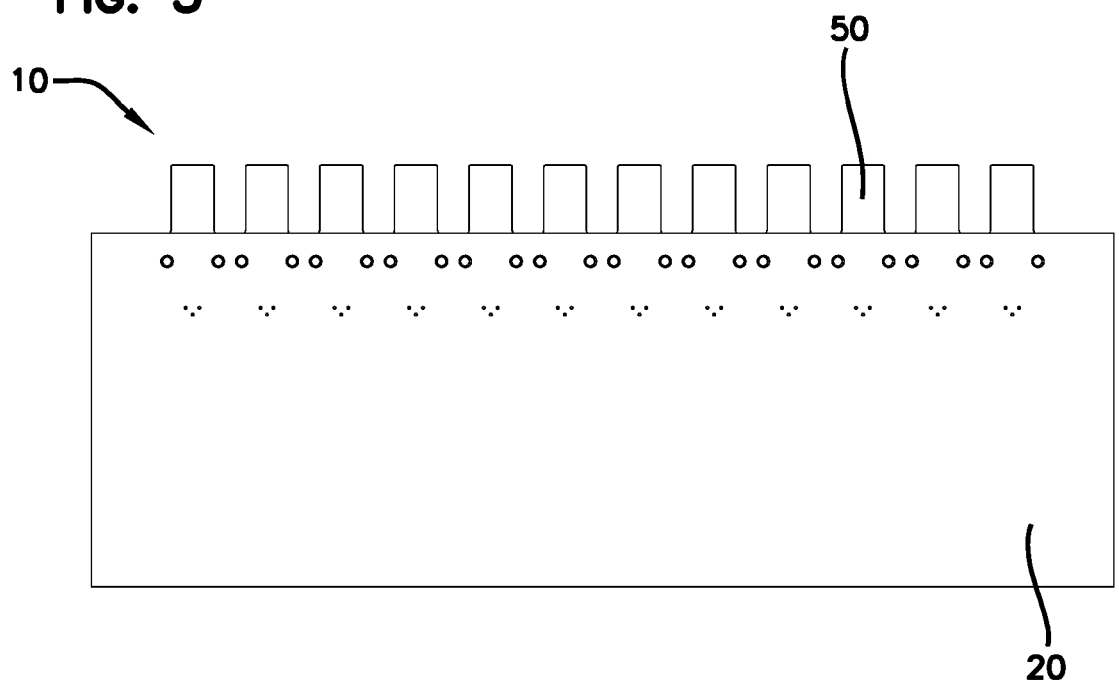
FIG. 3 is a bottom view of the board mounted active component assembly shown in FIG. 1.
Figure 4:
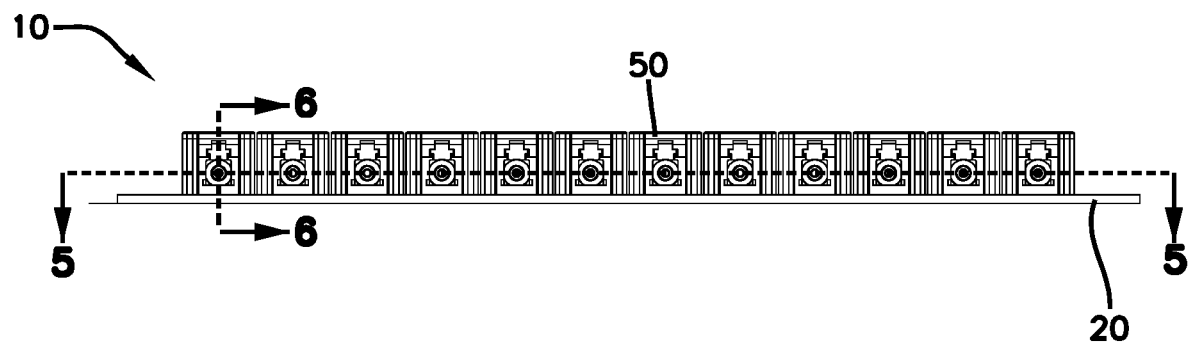
FIG. 4 is an end view of the board mounted active component assembly shown in FIG. 1.
Figure 5:
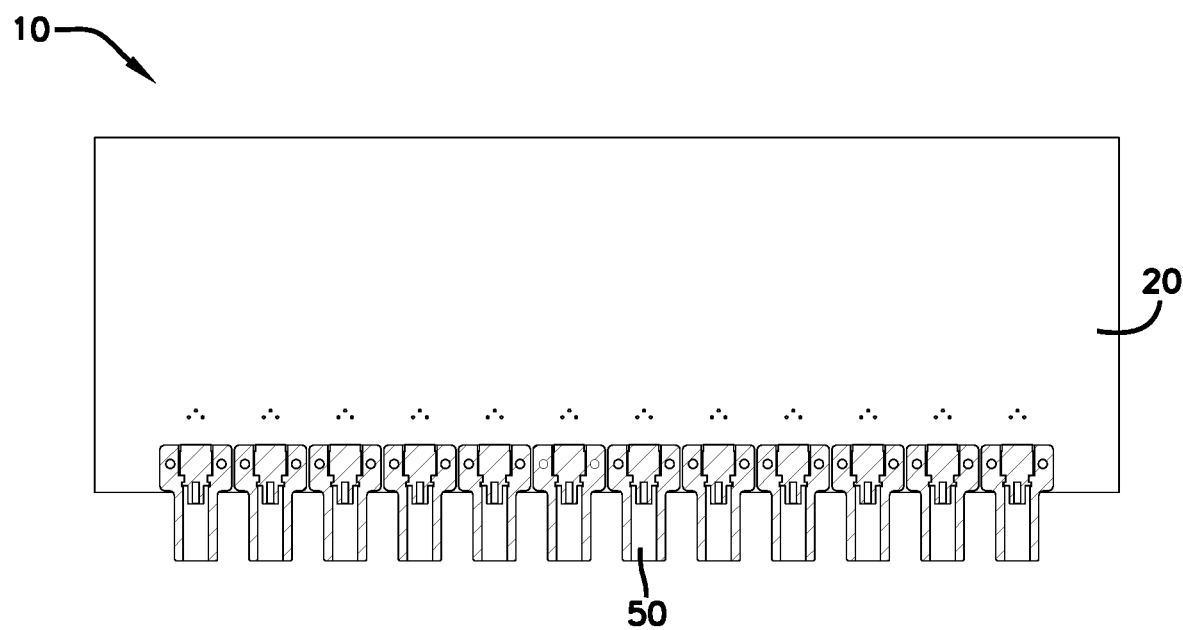
FIG. 5 is a cross-sectional view of the board mounted active component assembly shown in FIG. 1, taken along the line 5-5 in FIG. 4.
Figure 6:
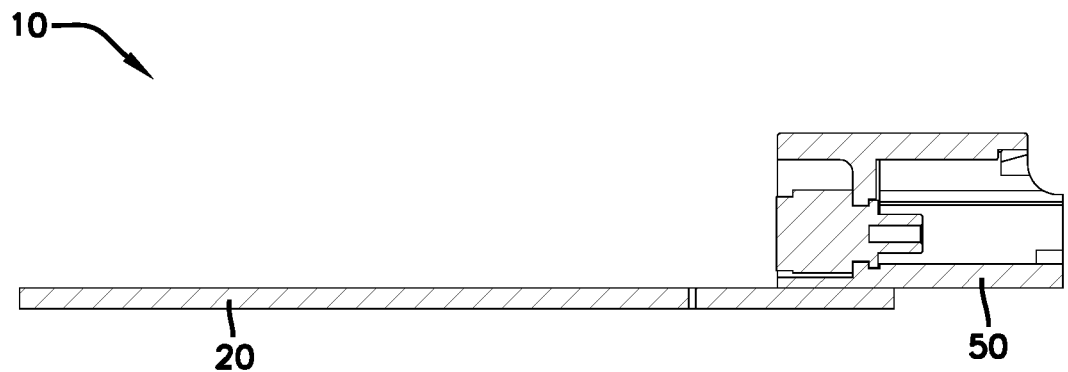
FIG. 6 is a cross-sectional view of the board mounted active component assembly shown in FIG. 1, taken along the line 6-6 in FIG. 4.
Figure 7:
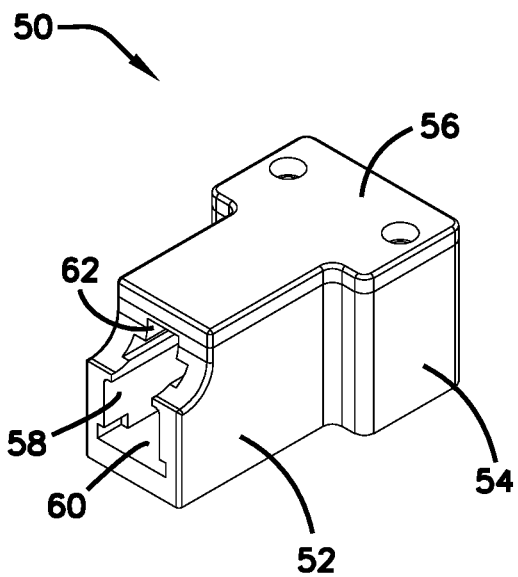
FIG. 7 is a top-perspective view of an isolated adapter of the board mounted active component assembly shown in FIG. 1.
Figure 8:
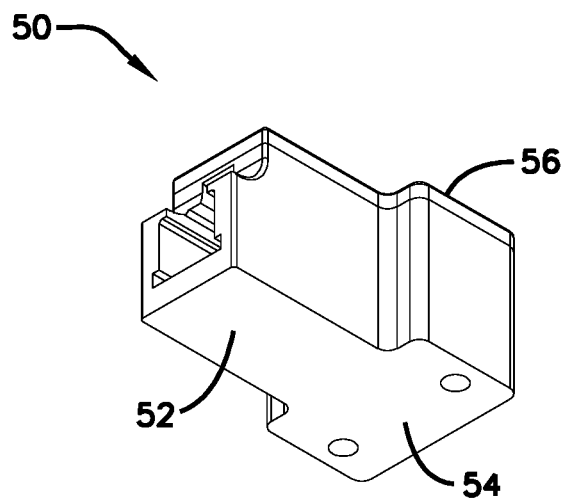
FIG. 8 is a bottom-perspective view of the adapter shown in FIG. 7.
Figure 9:
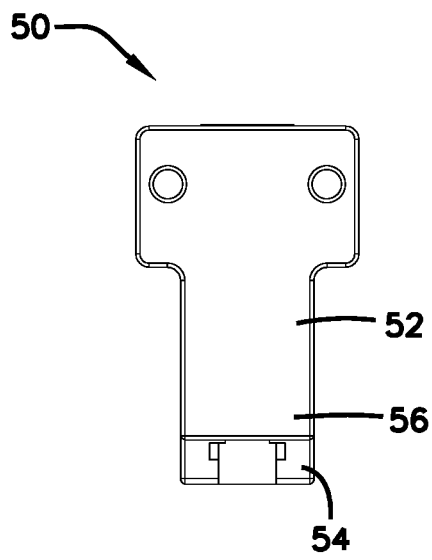
FIG. 9 is a top view of the adapter shown in FIG. 7.
Figure 10:
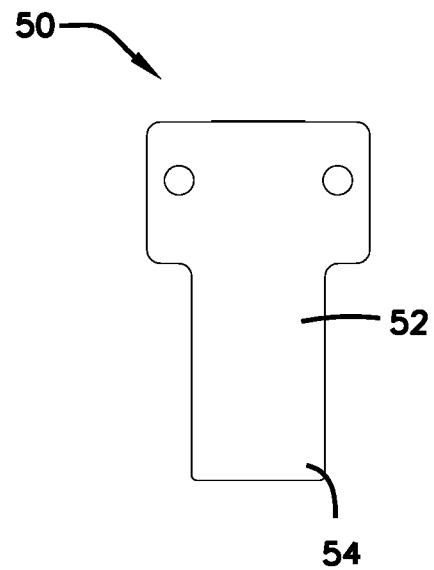
FIG. 10 is a bottom view of the adapter shown in FIG. 7.
Figure 11:
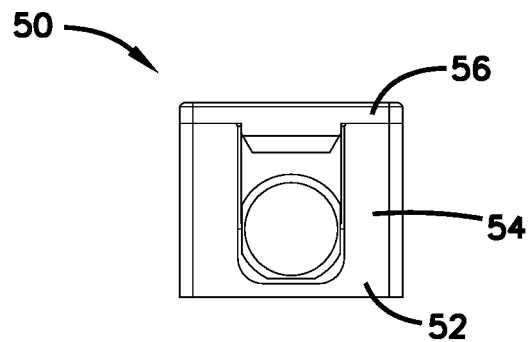
FIG. 11 is a rear view of the adapter shown in FIG. 7.
Figure 12:
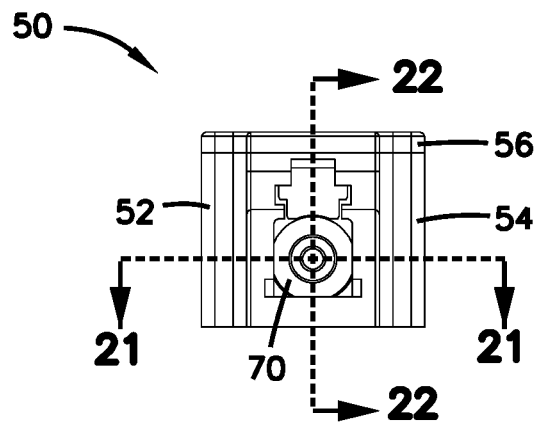
FIG. 12 is a front view of the adapter shown in FIG. 7.
Figure 13:
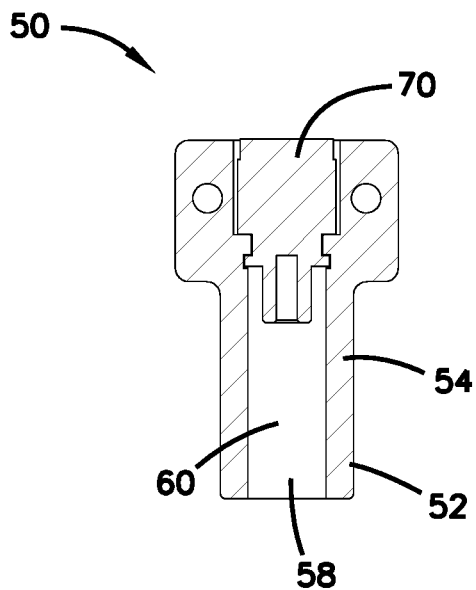
FIG. 13 is a cross-sectional view of the adapter shown in FIG. 7, taken along the line 13-13 in FIG. 12.
Figure 14:
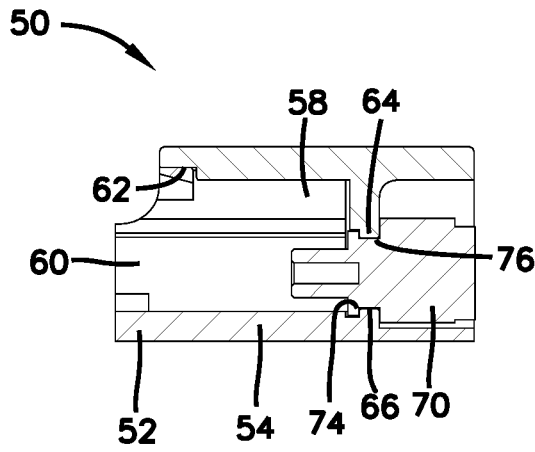
FIG. 14 is a cross-sectional view of the adapter shown in FIG. 7, taken along the line 14-14 in FIG. 12.
Figure 15:
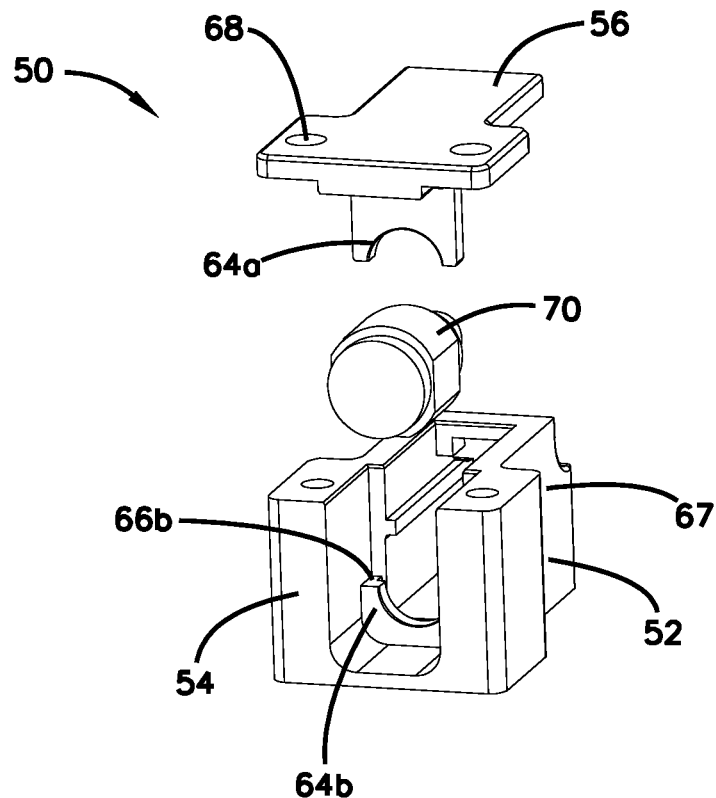
FIG. 15 is a front perspective exploded view of the adapter shown in FIG. 7.
Figure 16:
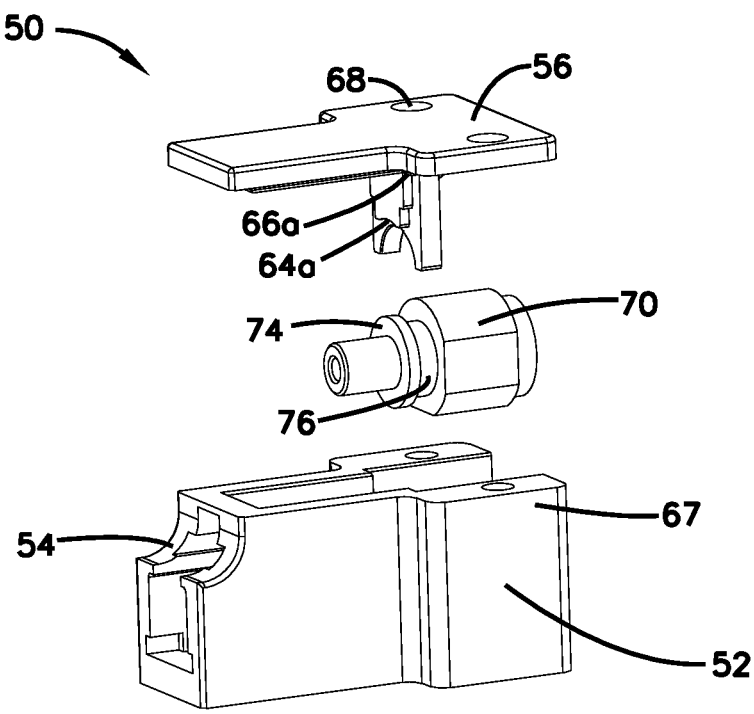
FIG. 16 is a rear perspective exploded view of the adapter shown in FIG. 7.
Figure 17:
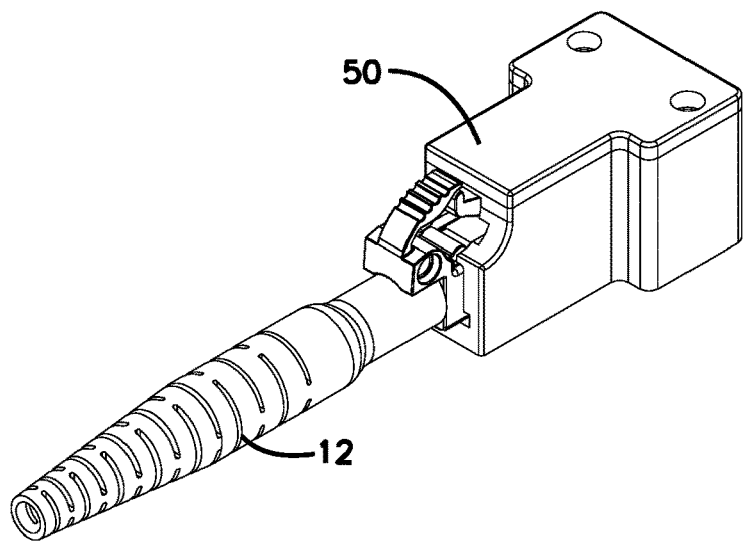
FIG. 17 is a perspective view of an optical plug inserted into the adapter shown in FIGS. 1-16.
Figure 18:
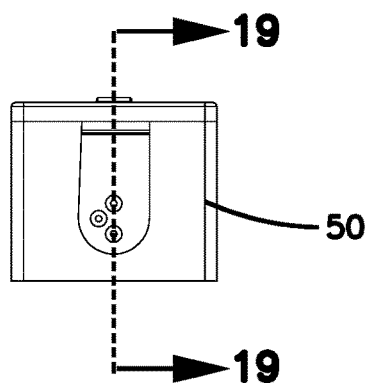
FIG. 18 is an end view of the plug and adapter shown in FIG. 17.
Figure 19:
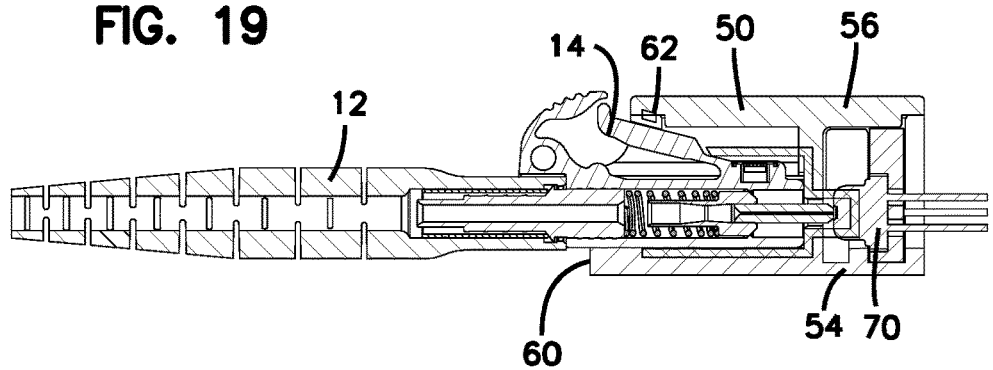
FIG. 19 is a cross-sectional view of the connector and adapter shown in FIG. 17, taken along the line 19-19 in FIG. 18.

Various examples will be described in detail with reference to the drawings, wherein like reference numerals represent like parts and assemblies throughout the several views. Reference to various examples does not limit the scope of the claims attached hereto. Additionally, any examples set forth in this specification are not intended to be limiting and merely set forth some of the many possible examples for the appended claims. Referring to the drawings wherein like reference numbers correspond to like or similar components throughout the several figures.

With reference to FIGS. 1-6, a board mounted active component assembly 10 is shown. As noted previously, the assembly 10 is a TOSA/ROSA system enabling managed connectivity of patch cords with managed connectivity data (electrical), and enabling calculation of the insertion loss of the patch cord assembly (optical). In one aspect, the assembly 10 includes a printed circuit board (PCB) 20 to which a plurality of connectors 50 are mounted. The connectors 50 can include fiber optic transceiver modules 70 which are connected to circuits provided on the printed circuit board 20 via leads 72. The leads 72 are shown at FIGS. 2 and 20-23, but are otherwise not shown, as the depicted fiber optic transceiver modules 70 are shown as a general schematic depiction.

In the example shown at FIGS. 1-23, twelve connectors 50 are shown as being mounted to the printed circuit board 20. More of fewer connectors can be provided. In one aspect, the connectors 50 are shown as being single-port LC optical interfaces for accepting a simplex LC-type optical plug 12. The connectors 50 can be configured to accept other types of connectors or optical plugs, such as LC-duplex, SC-simplex, SC-duplex, MPO/MTP, or MT-RJ plugs.

As shown, the connector 50 is shown as including a housing 52 within which a fiber optic transceiver module 70 is mounted. In one example, the housing 52 is an injection molded plastic component. The fiber optic transceiver module 70 can be configured with a transmitter optical sub-assembly (TOSA) and a receiver optical sub-assembly (ROSA). Each of the TOSA and ROSA can include a laser diode, optical interface, photodiode, and an electrical interface. The fiber optic transceiver module 70 can also be configured with a bi-directional optical sub-assembly (BOSA). The BOSA can include a TOSA, a ROSA, and a wavelength-division multiplexing (WDM) filter. As stated previously, the transceiver module 70 can include leads 72 which are connected to the printed circuit board 20.

In one aspect, the housing 52 can include a base shell 54 and a cover shell 56 that together define an internal cavity 58 within which the transceiver module 70 is secured. The base shell 54 and cover shell 56 define an adapter port 60 within which the optical plug 12 can be received and placed into optical communication with the transceiver module 70. The housing 52 can be provided with a catch feature 62 that interfaces with a latching mechanism 14 of the optical plug 12 to ensure a secure connection between the optical plug 12 and the housing 52.

In one aspect, the housing 52 is provided with a circumferential projection wall 64 adjacent to a circumferential groove 66 while the transceiver module 70 is provided with a circumferential projection wall 74 and a circumferential groove 76. The housing circumferential groove 66 receives the transceiver module circumferential projection wall 74 while the transceiver module circumferential groove 76 receives the housing circumferential projection wall 64. These cooperating features operate to secure and align the transceiver module 70 within the housing 52 such that the inserted optical plug 12 will be sufficiently aligned with the transceiver module 70. As can most easily seen at FIGS. 15 and 16, the housing circumferential projection wall 64 and the circumferential groove 66 are formed by both the base shell 54 and the cover shell 56 such that the circumferential projection wall 64 is formed by a first part 64a and a second part 64b and the circumferential groove 66 is formed by a first part 66a and a second part 66b. This configuration allows for the transceiver module 70 to be inserted into the base shell 54 and then fully secured in place by the installation of the cover shell 56. Although the projection walls 64, 74 and grooves 66, 76 are shown as being circular, other shapes can be utilized such as rectangular or ovalized shapes.

As can be seen at FIGS. 1-16 the base shell 54 and cover shell 56 can be provided with respective openings 67 and 68 for receiving fasteners 80. An example fastener 80 is most easily viewed at FIG. 21 in which the openings 67 are threaded and the fasteners 80 are screws. This configuration allows for the connector to be disassembled and reassembled. Other methods for securing the cover shell 56 to the base shell 54 may also be utilized. For example, snap-fit type connections, adhesives, and non-removable fasteners may be utilized. The fasteners 80 may also be configured to extend to or through the printed circuit board 20 such that the fasteners 80 can also function to secure the connectors 50 to the printed circuit board 20. In such an example, the openings 67 would be non-threaded and a threaded nut or similar component would be provided on the opposite side of the printed circuit board 20 such that the fastener 80 and nut operate to clamp the cover shell 56, the base shell 54, and the printed circuit board 20 together in a secured fashion.

Figure 20:
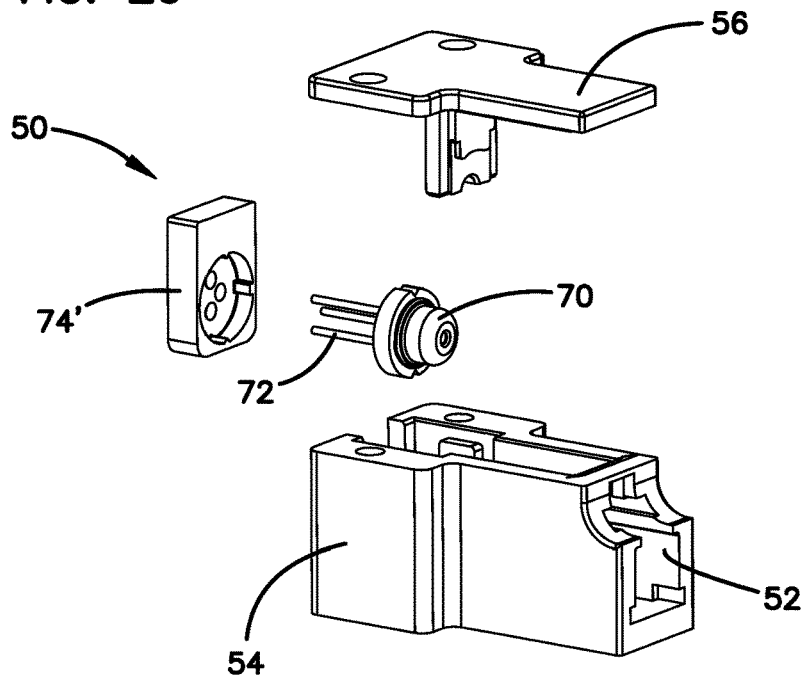
FIG. 20 is an exploded perspective view of the adapter shown in FIGS. 1-16, additionally showing leads of the diode.
Figure 21:
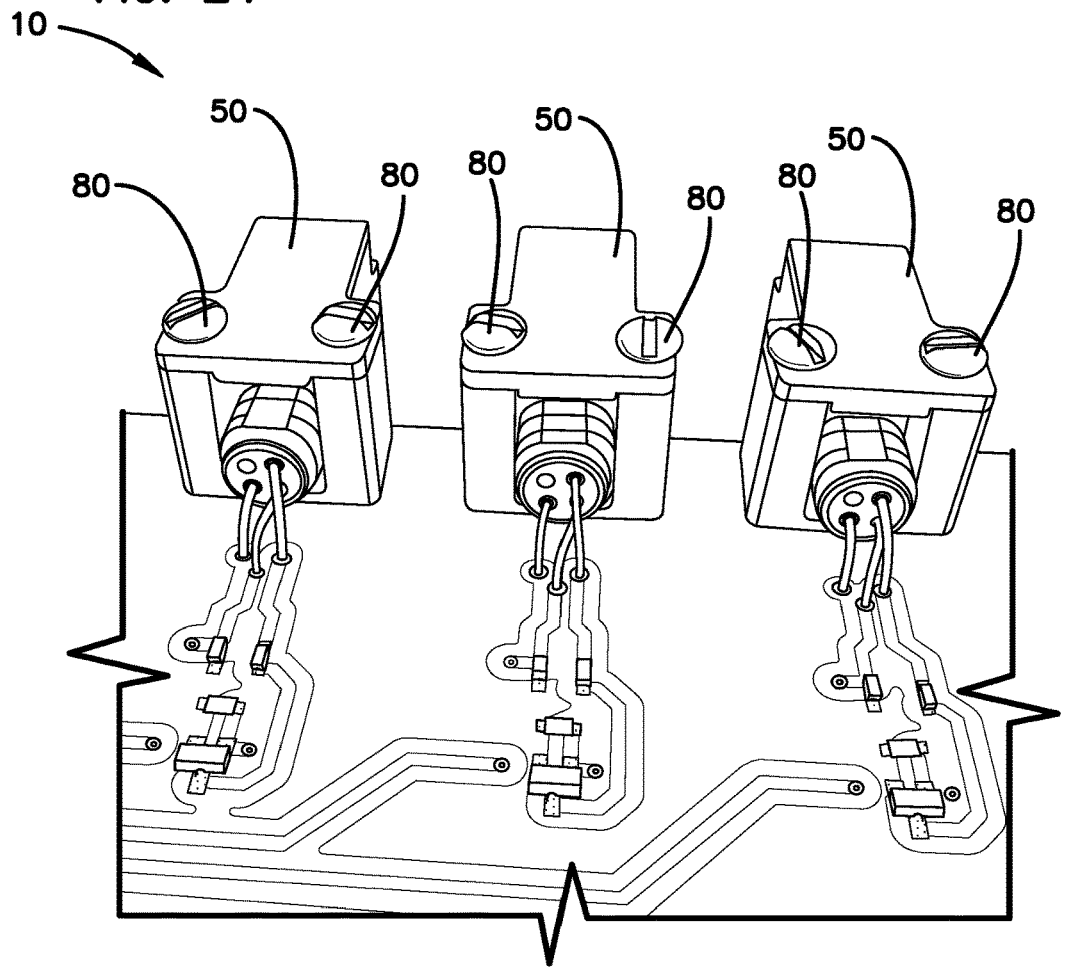
FIG. 21 is a perspective view of a plurality of the adapters shown in FIG. 20 mounted and connected to a printed circuit board.
Figure 22:
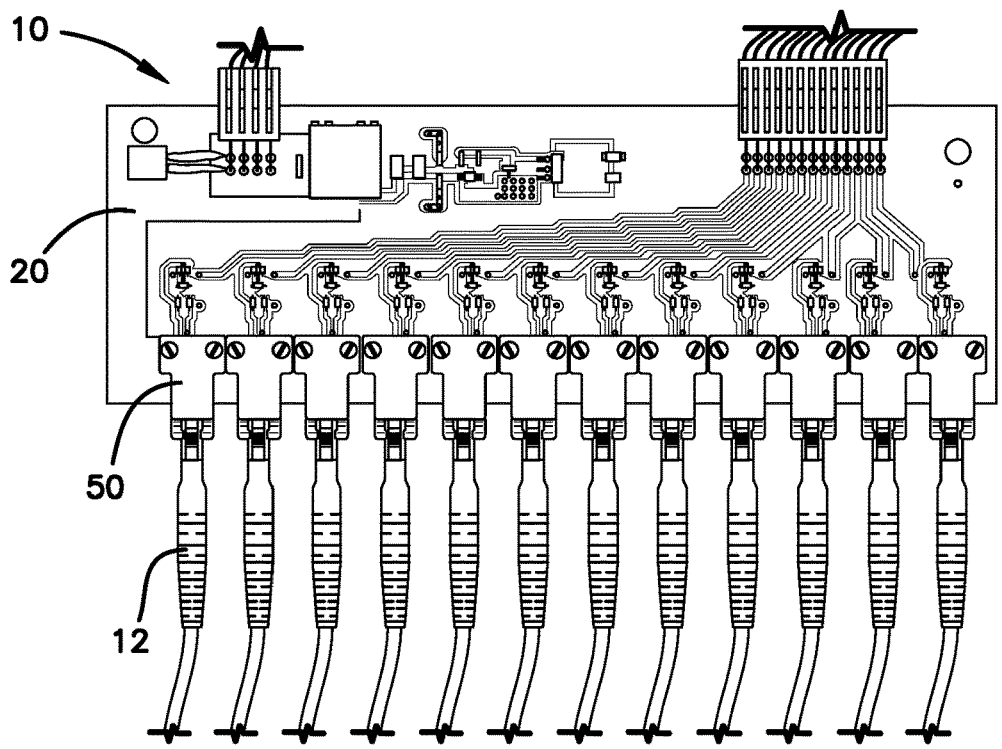
FIG. 22 is a top view of an example board mounted active component assembly in accordance with the disclosure and having a plurality of optical plugs connected to a plurality of adapters of the board mounted active component assembly.
Figure 23:
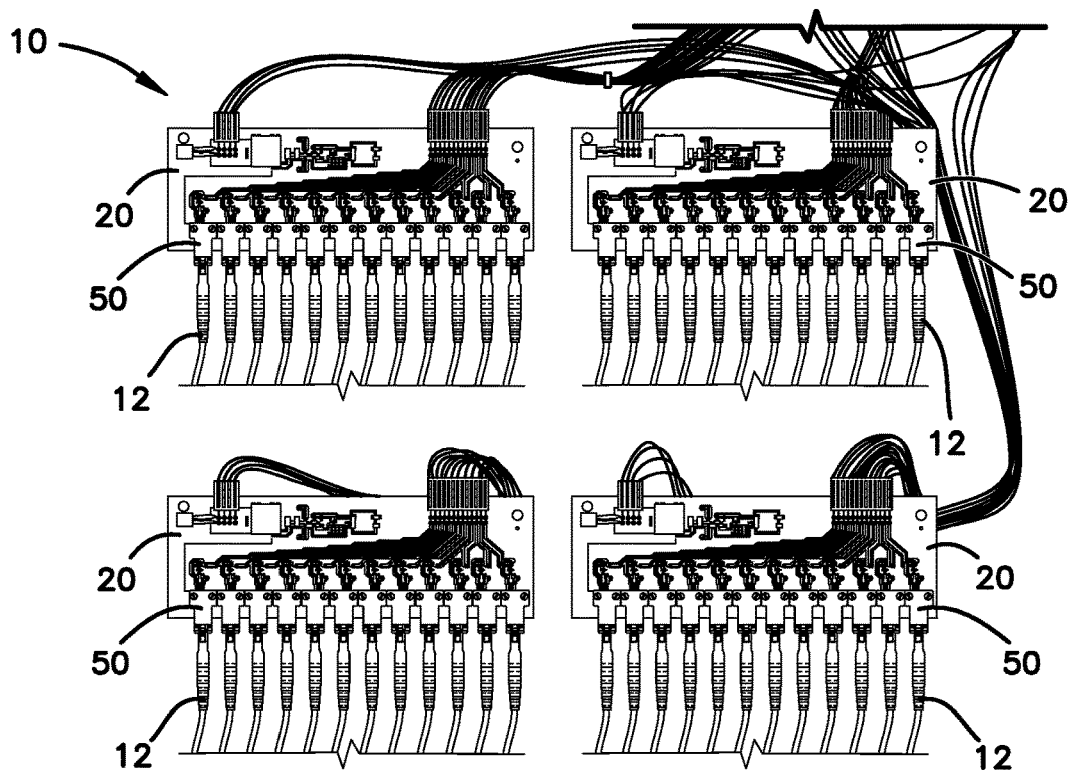
FIG. 23 is a top view of a plurality of the board mounted active component assemblies shown in FIG. 22.
Figure 24:
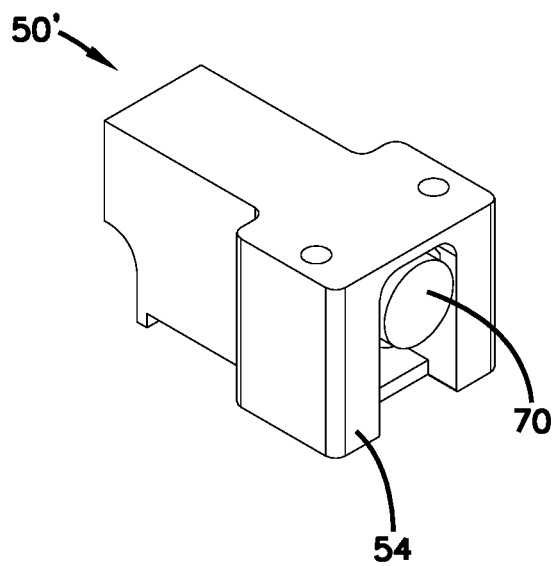
FIG. 24 is a top-perspective view of an isolated adapter usable with the board mounted active component assembly shown in FIG. 1.
Figure 25:
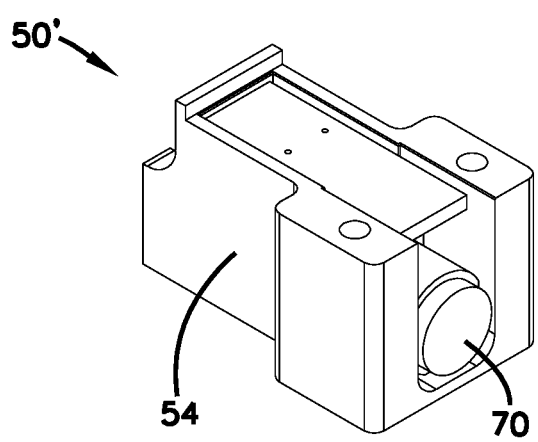
FIG. 25 is a bottom-perspective view of the adapter shown in FIG. 24.
Figure 26:
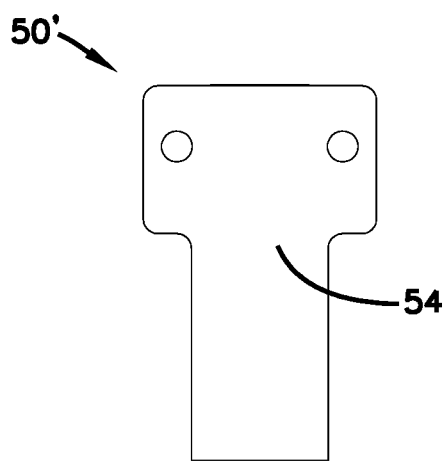
FIG. 26 is a top view of the adapter shown in FIG. 24.
Figure 27:
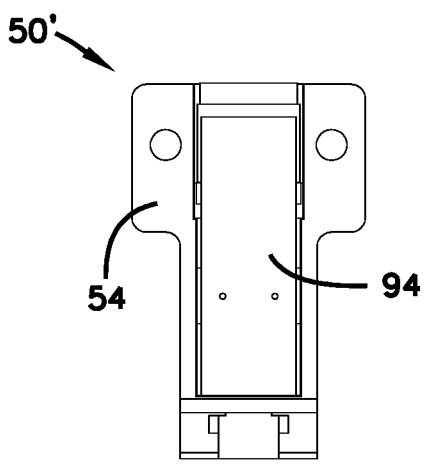
FIG. 27 is a bottom view of the adapter shown in FIG. 24.
Figure 28:
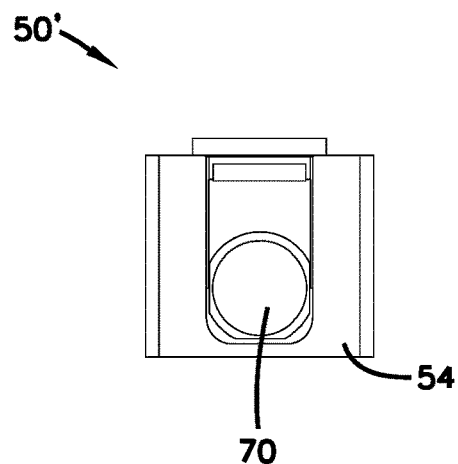
FIG. 28 is a rear view of the adapter shown in FIG. 24.
Figure 29:
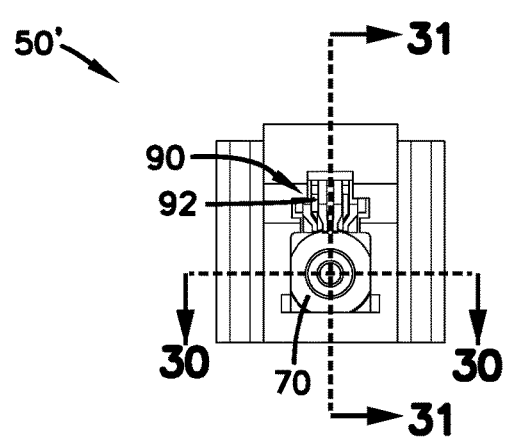
FIG. 29 is a front view of the adapter shown in FIG. 24.
Figure 30:
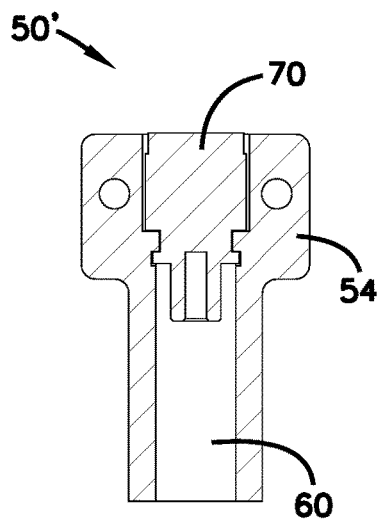
FIG. 30 is a cross-sectional view of the adapter shown in FIG. 24, taken along the line 30-30 in FIG. 20.
Figure 31:
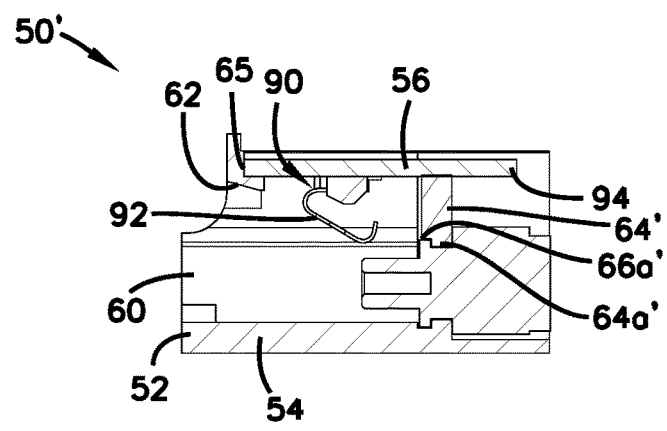
FIG. 31 is a cross-sectional view of the adapter shown in FIG. 24, taken along the line 31-31 in FIG. 20.
Figure 32:
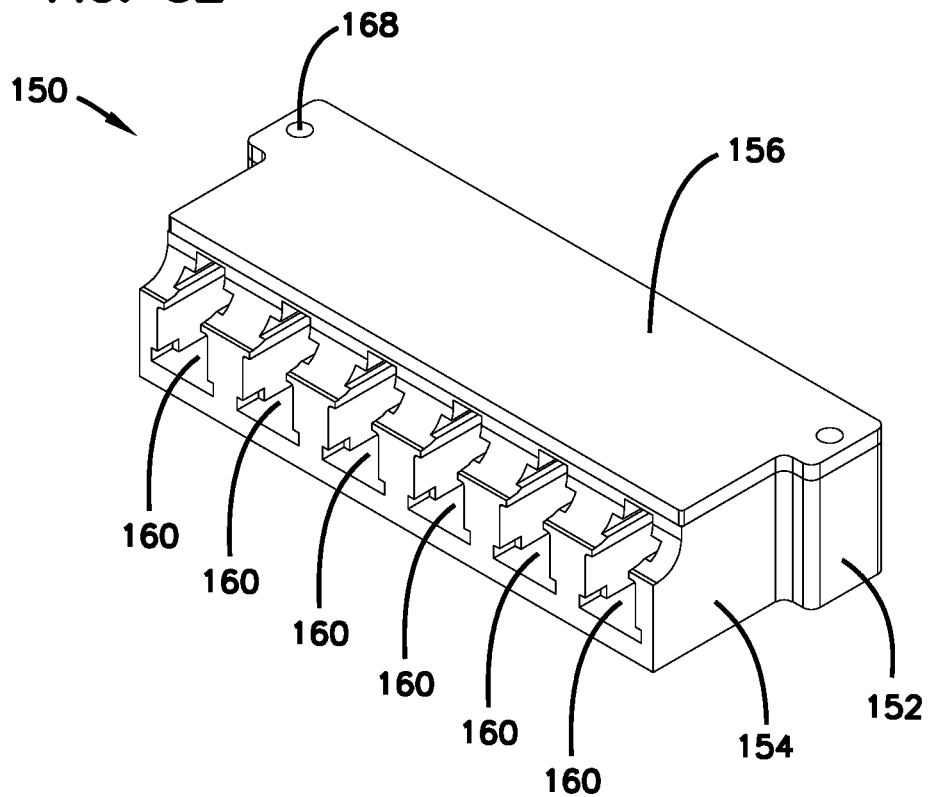
FIG. 32 is a top-perspective view of an isolated adapter usable with the board mounted active component assembly shown in FIG. 1.
Figure 33:
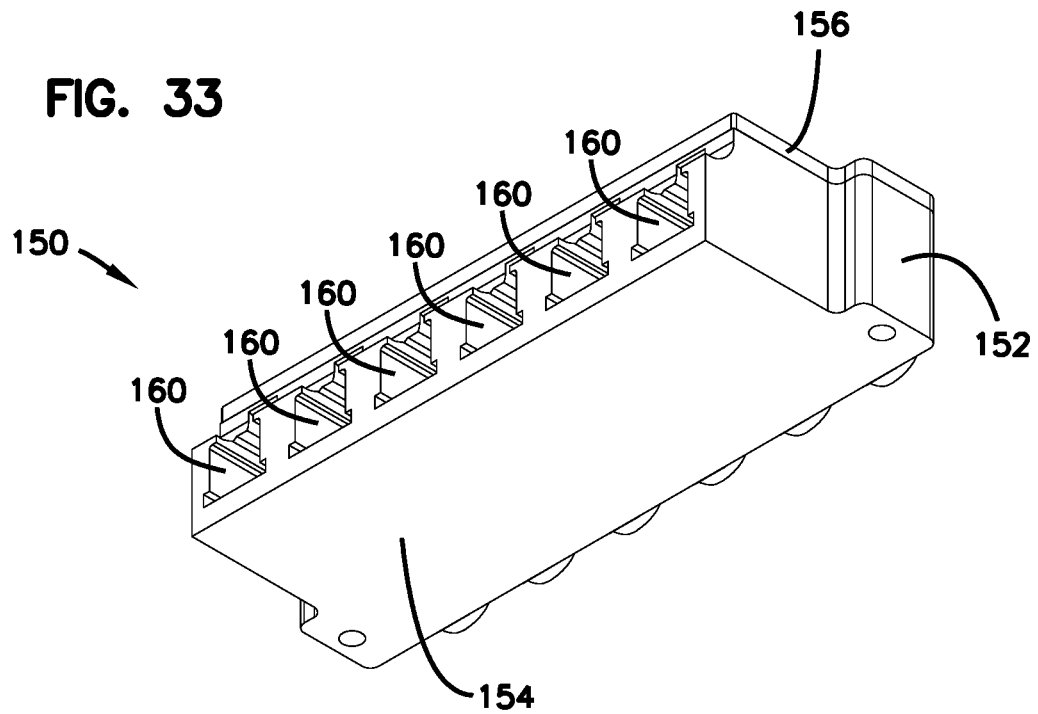
FIG. 33 is a bottom-perspective view of the adapter shown in FIG. 32.
Figure 34:
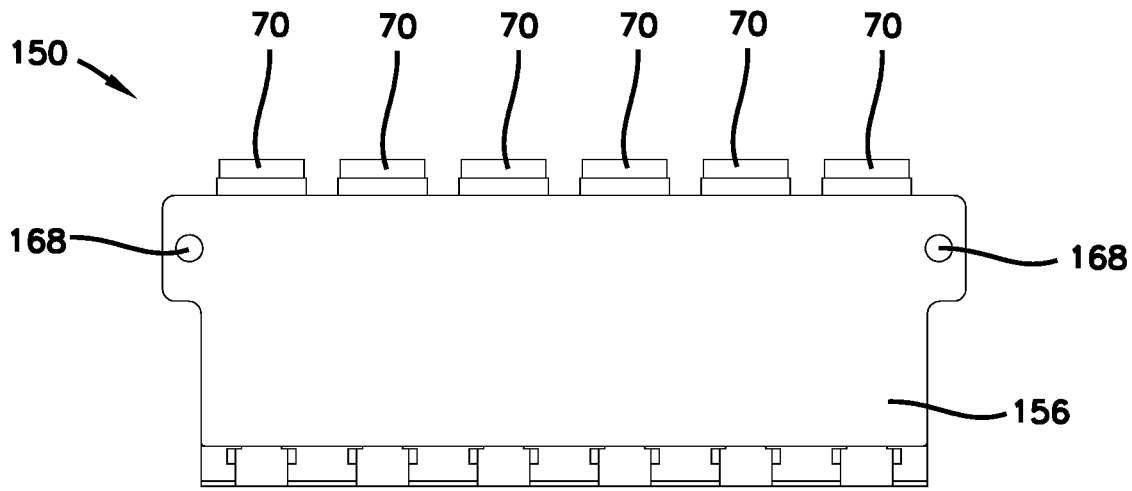
FIG. 34 is a top view of the adapter shown in FIG. 32.
Figure 35:
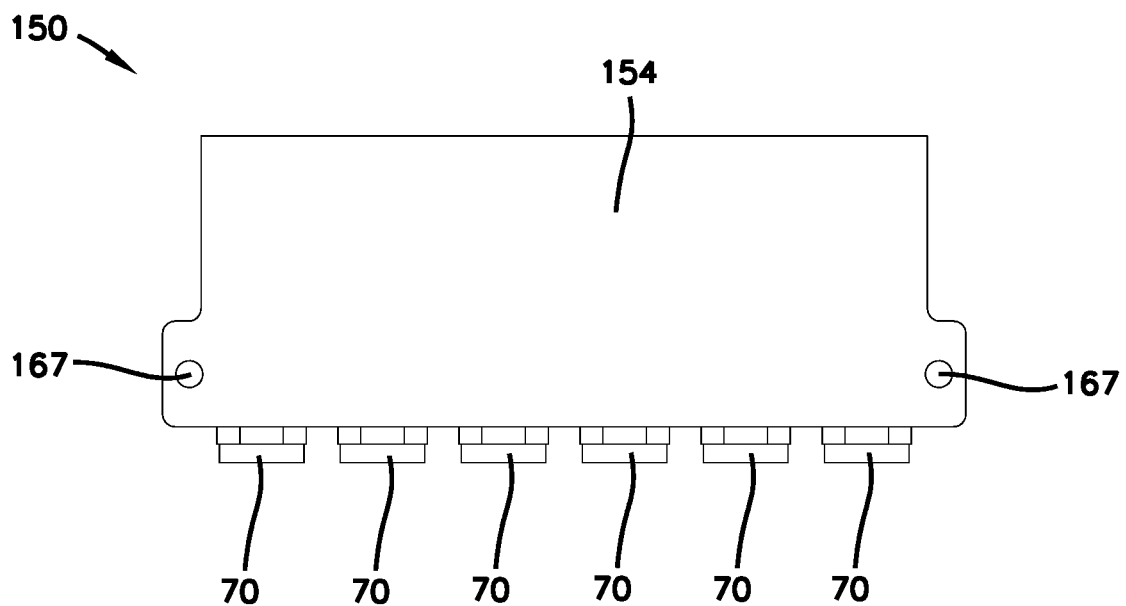
FIG. 35 is a bottom view of the adapter shown in FIG. 32.
Figure 36:
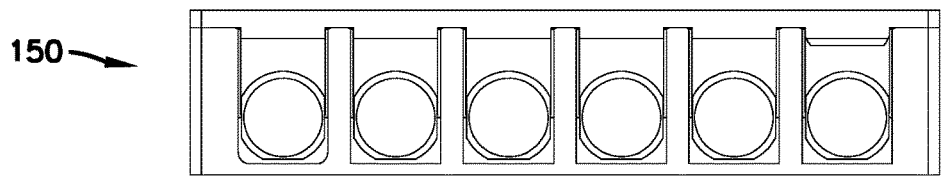
FIG. 36 is a rear view of the adapter shown in FIG. 32.
Figure 37:
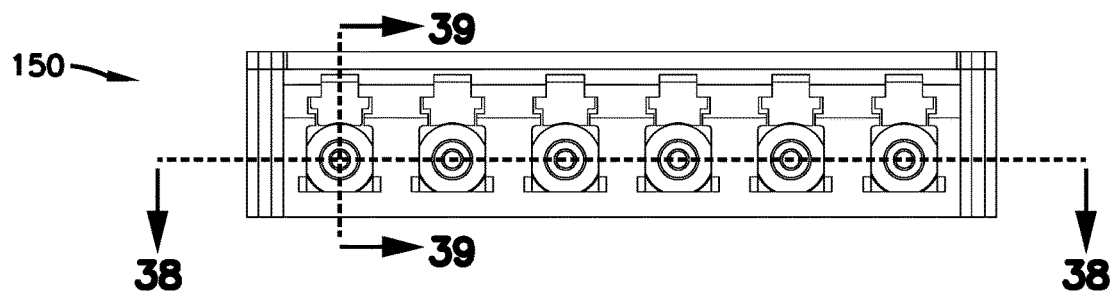
FIG. 37 is a front view of the adapter shown in FIG. 32.
Figure 38:
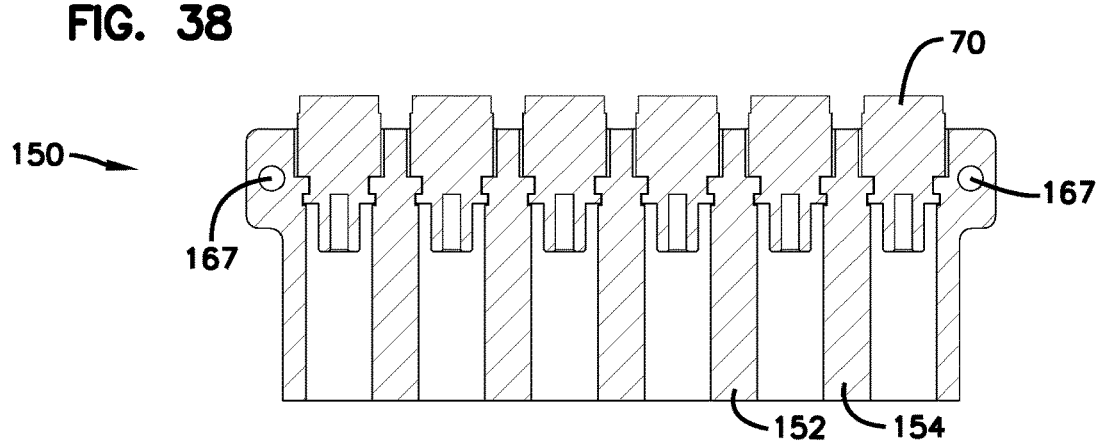
FIG. 38 is a cross-sectional view of the adapter shown in FIG. 32, taken along the line 38-38 in FIG. 37.
Figure 39:
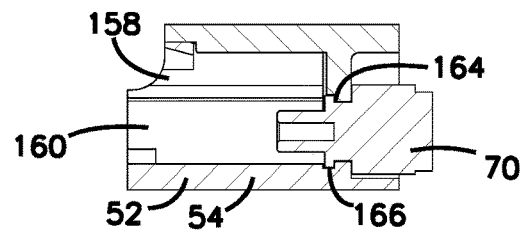
FIG. 39 is a cross-sectional view of the adapter shown in FIG. 32, taken along the line 39-39 in FIG. 37.

It is noted that the connector 50 shown at FIGS. 20 and 21 is a slightly modified version of the connector 50 shown at FIGS. 1-19 in that a separate wall component 74' is provided that is received within recesses of the base shell 54 and cover shell 56 to ensure securement and alignment of the transceiver module 70.

Referring to FIGS. 24-31, a connector 50' is presented which is another variation of the connector 50 shown at FIGS. 1-18. Many of the features of the connector 50' are shared with connector 50 and need not be repeated and further discussed here. It is noted that connector 50' is shown without cover shell 56 for the purpose of clarity, but can utilize a cover shell of the same general design shown in FIGS. 1-19. The primary difference between the connector 50' and connector 50 is that connector 50' is configured with an identification feature 90 including circuitry for center point identification (CPID). The identification feature 90 includes contacts 92 that engage with cooperating contacts on the optical plug 12 such that the network can identify the actual location of the connection of optical plug 12. As shown, the contacts 92 are connected to a supporting structure and/or printed circuit board 94 which can be received into a groove 65 in the base shell 54. The supporting structure 94 can also define the first portions of the wall projection 64a' and the groove 66a'.

Referring to FIGS. 32-39, a connector 150 is shown that is yet another variation of the connector 50 shown at FIGS. 1-18. Many of the features of the connector 150 are shared with connector 50 and need not be repeated and further discussed here. The primary difference between connectors 50, 150 is that connector 150 is shown as including a housing 152 that defines a plurality of LC-type adapter ports 160 within the same base shell 154 and cover shell 156. As shown, the multi-port connector 150 is shown as being provided with six adapter ports 160. However, other numbers of ports are possible, such as two, four, eight and twelve ports. As with connector 50, the adapter ports 160 can also be configured with LC-duplex, SC-simplex, SC-duplex, MPO/MTP, and/or MT-RJ plugs.

In order to facilitate the housing of multiple adapter ports 160, the housing shell 154 is provided with a plurality of intervening or separation walls 155 that separate the adapter ports 160 from each other. As with connector 50, the base shell 154 and cover shell 156 of connector 150 can be provided with wall projections 164 and grooves 166 for each adapter port 160 to interact with and secure the transceiver modules 70. However, a portion of the wall projections 164 and grooves 166 is formed within the intervening walls 155. The base shell 154 is also shown as being provided with openings 167 and the cover shell 156 is shown as being provided with openings 168 that function in the same fashion as already described for openings 67, 68. The connector 150 may be provided with additional openings 167, 168 at the location of any of the intervening walls to provide for additional securement, if desired. Additionally, a combination of adhesives/connections and fasteners 80 may also be utilized.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the disclosure. It is particularly noted that the disclosure is not limited to the discrete embodiments disclosed, as many combinations of features among and between the disclosed embodiments can be combined in a number of ways.

It is claimed:

1. A board mounted active component assembly comprising:
    a) a printed circuit board;
    b) a connector including a housing defining an adapter port for receiving an optical plug, the connector being mounted to the printed circuit board, the housing including a unitarily formed base shell and a unitarily formed cover shell that cooperatively form an internal cavity defining the adapter port; and
    c) a fiber optic transceiver module secured within the housing such that the base shell and cover shell cooperate to optically align the transceiver module with an optical plug received in the adapter port, wherein the base shell and cover shell cooperatively define a single circumferential projection wall with opposite outward-facing first and second sides with a first part defined by the base shell and a second part defined by the cover shell, wherein the single circumferential projection wall is entirely defined by the base shell and the cover shell, wherein the cover shell extends over the fiber optic transceiver module such that the first and second parts directly are received into a single groove with opposite inward-facing first and second sides defined in the fiber optic transceiver module to secure the fiber optic transceiver module within the housing such that the first side of the single circumferential projection wall is adjacent the first side of the single groove and a second side of the single circumferential projection wall is adjacent the second side of the single groove, wherein the fiber optic transceiver module includes a transmitter optical sub-assembly (TOSA) and a receiver optical sub-assembly (ROSA) with leads connected to a circuit on the printed circuit board;
    d) wherein the housing defines an opening in a top side of the housing for receiving the fiber optic transceiver module, and wherein the cover shell completely covers the opening.

2. The board mounted active component assembly of claim 1, wherein:
    a) the connector includes a plurality of connectors.

3. The board mounted active component assembly of claim 2, wherein the plurality of connectors includes twelve connectors.

4. The board mounted active component assembly of claim 1, wherein the adapter port is an LC-type port.

5. The board mounted active component assembly of claim 1, wherein the connector includes a plurality of adapter ports.

6. The board mounted active component assembly of claim 5, wherein the connector includes six adapter ports.

7. The board mounted active component assembly of claim 5, wherein the plurality of adapter ports are LC-type ports.

8. The board mounted active component assembly of claim 1, wherein the cover shell is secured to the base shell by at least one fastener.

9. The board mounted active component assembly claim 1, wherein the connector includes one or more fastener openings for receiving a fastener for securing the connector to the printed circuit board.

10. A connector for connecting and mounting to a printed circuit board of a board mounted active component assembly, the connector comprising:
    a) a housing including a unitarily formed base shell and a unitarily formed cover shell that cooperatively form an internal cavity defining an adapter port for receiving an optical plug; and b) a fiber optic transceiver module secured within the housing such that the base shell and cover shell cooperate to optically align the transceiver module with an optical plug received in the adapter port, wherein the cover shell extends over both the adapter port and the fiber optic transceiver and includes a wall projection member directly engaging with the fiber optic transceiver module to secure the fiber optic transceiver module within the housing, wherein the fiber optic transceiver module includes a transmitter optical sub-assembly (TOSA) and a receiver optical sub-assembly (ROSA) with leads for connecting to a circuit on the printed circuit board, wherein the base shell and cover shell cooperatively define a single first wall projection with opposite outward-facing first and second sides and the transceiver module defines a single groove with opposite inward-facing first and second sides receiving the first wall projection such that the first side of the single first wall projection is adjacent a first side of the single groove and a second side of the single wall projection is adjacent a second side of the single groove, wherein the single first wall projection is entirely defined by the base shell and the cover shell.

11. The connector of claim 10, wherein:
a) the housing includes a plurality of adapter ports.

12. The connector of claim 10, wherein the adapter port is an LC-type port.

13. The connector of claim 11, wherein the connector includes six adapter ports.

14. The connector of claim 10, wherein the cover shell is secured to the base shell by at least one fastener, wherein the connector includes one or more fastener openings for receiving the at least one fastener.

15. The board mounted active component assembly of claim 1, wherein the fiber optic transceiver module has a pair of oppositely positioned flat sides received by corresponding flat sides of the base shell.

16. The connector of claim 10, wherein the fiber optic transceiver module has a pair of oppositely positioned flat sides received by corresponding flat sides of the base shell.

* * * * *

UNITED STATES PATENT AND TRADEMARK OFFICE
CERTIFICATE OF CORRECTION

| | | |
|---|---|---|
| PATENT NO. | : 11,226,453 B2 | |
| APPLICATION NO. | : 16/059493 | |
| DATED | : January 18, 2022 | |
| INVENTOR(S) | : Coffey et al. | |

It is certified that error appears in the above-identified patent and that said Letters Patent is hereby corrected as shown below:

In the Claims

Column 6, Line 57, Claim 9: "assembly claim" should read --assembly of claim--

Signed and Sealed this
Twenty-eighth Day of June, 2022

*Katherine Kelly Vidal*

Katherine Kelly Vidal
*Director of the United States Patent and Trademark Office*